United States Patent [19]
Suenaga

[11] Patent Number: 6,057,185
[45] Date of Patent: *May 2, 2000

[54] METHOD OF MANUFACTURING SEMICONDUCTOR DEVICE

[75] Inventor: Jun Suenaga, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/705,656

[22] Filed: Aug. 30, 1996

[30] Foreign Application Priority Data

Sep. 8, 1995 [JP] Japan ................................. 7-257162

[51] Int. Cl.⁷ .............................................. H01L 21/8238
[52] U.S. Cl. ........................ 438/229; 438/232; 438/305; 438/586; 438/592; 438/299; 438/301; 438/307
[58] Field of Search ................................... 438/FOR 168, 438/207, 287, 696, 229, 232, 305, 586, 592, 655, 656, 299, 301, 307; 257/369, 784

[56] References Cited

U.S. PATENT DOCUMENTS

| | | | |
|---|---|---|---|
| 4,474,624 | 10/1984 | Matthews | 438/232 |
| 4,480,375 | 11/1984 | Cottrell et al. | 438/232 |
| 5,106,768 | 4/1992 | Kuo | 438/229 |
| 5,399,506 | 3/1995 | Tsukamoto | 438/301 |
| 5,489,540 | 2/1996 | Liu et al. | 438/232 |
| 5,506,158 | 4/1996 | Eklund | 438/207 |
| 5,510,295 | 4/1996 | Cabral, Jr. et al. | 438/656 |
| 5,665,646 | 9/1997 | Kitano | 438/592 |
| 5,672,544 | 9/1997 | Pan | 438/305 |
| 5,776,822 | 7/1998 | Fujii et al. | 438/586 |
| 5,801,425 | 9/1998 | Kuroi et al. | 257/383 |
| 5,849,634 | 12/1998 | Iwata | 438/655 |

FOREIGN PATENT DOCUMENTS

| | | | |
|---|---|---|---|
| 60-74663 | 4/1985 | Japan | 438/FOR 168 |
| 1-145849 | 6/1989 | Japan | 438/FOR 168 |
| 1-165159 | 6/1989 | Japan | 438/FOR 168 |

*Primary Examiner*—Carl Whitehead, Jr.
*Assistant Examiner*—Khanh Duong
*Attorney, Agent, or Firm*—Ronald P. Kananen; Rader, Fishman & Grauer

[57] ABSTRACT

An N-type impurity is ion-implanted in the exposed surface of a semiconductor substrate, thereby forming N-type diffusion layers. A P-type impurity is ion-implanted in the semiconductor substrate covered with a cover film, thereby forming P-type diffusion layers. A compound film of a semiconductor and a metal is formed on each of the surfaces of the N-type and P-type diffusion layers.

17 Claims, 8 Drawing Sheets

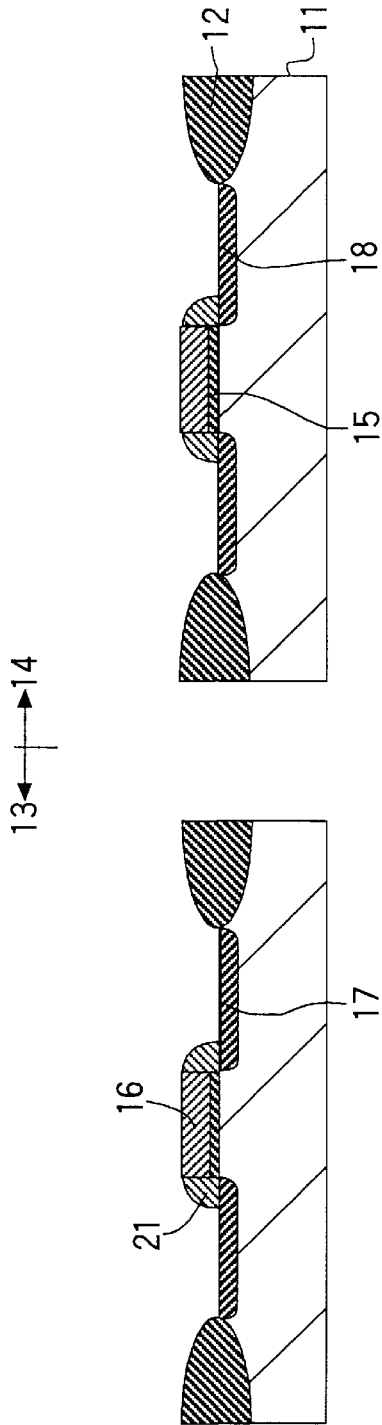
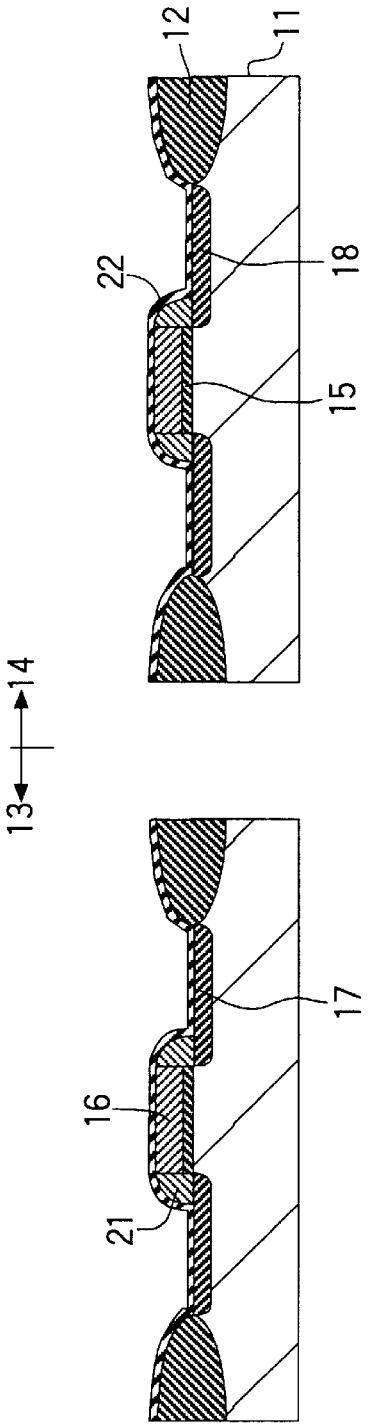

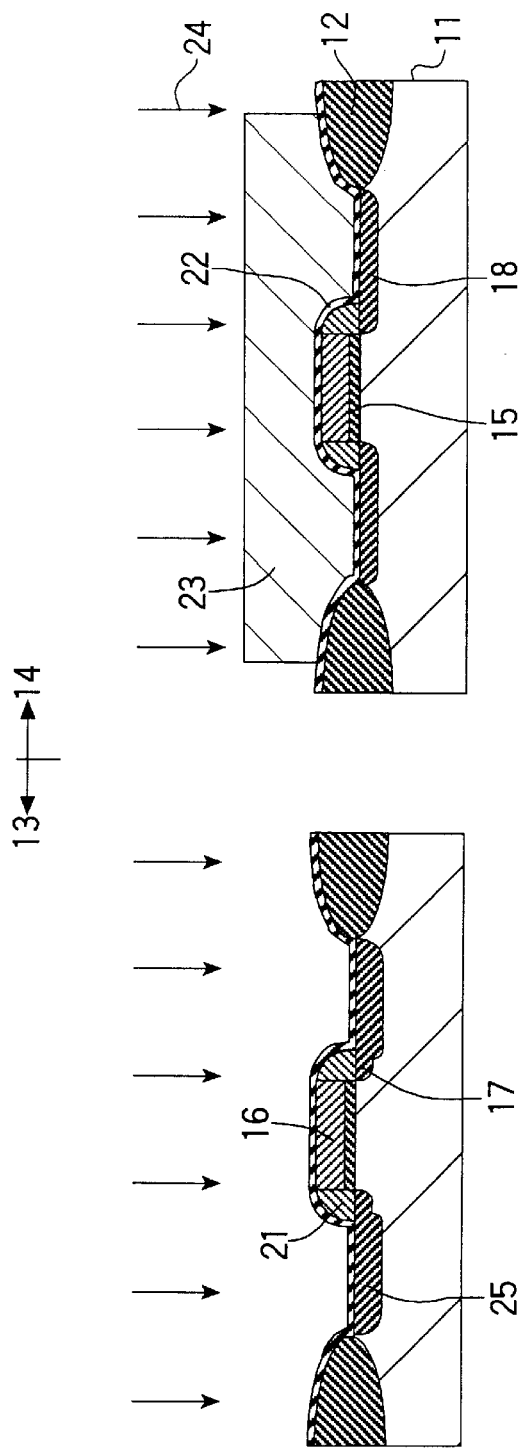
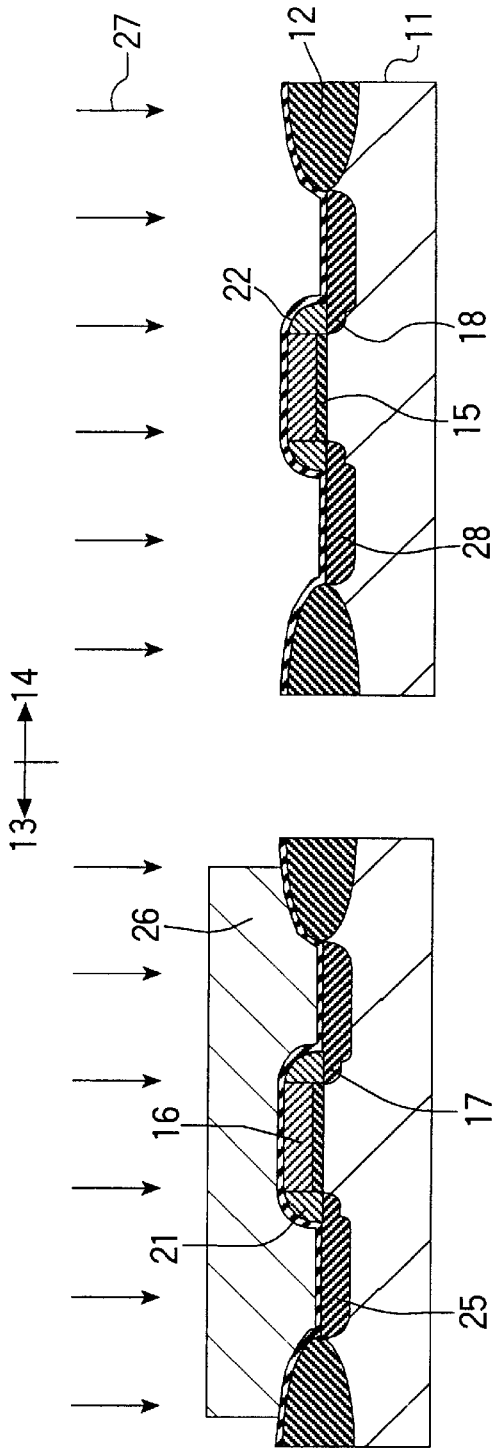
Fig.1C RELATED ART
Fig.1D RELATED ART

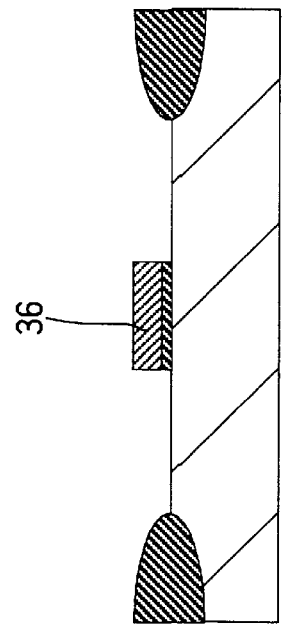
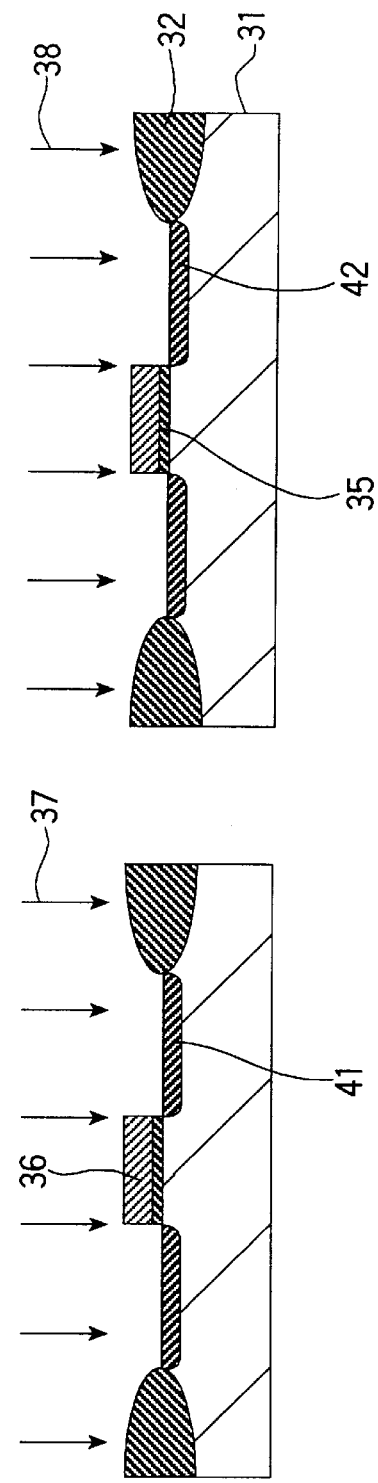
Fig.2A
Fig.2B

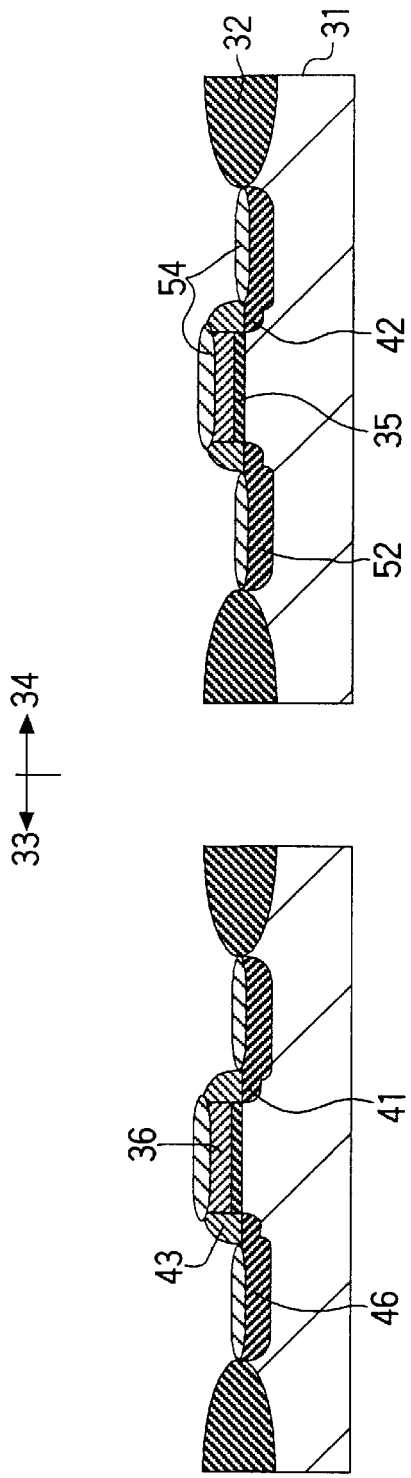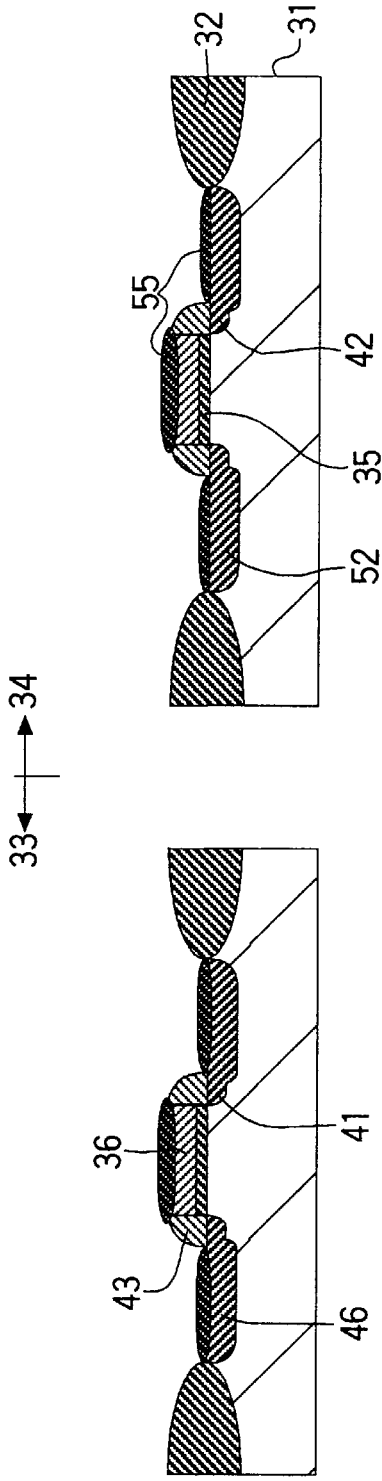

METHOD OF MANUFACTURING SEMICONDUCTOR DEVICE

BACKGROUND OF THE INVENTION

1. Field of the Invention

The present invention relates to a method of manufacturing a semiconductor device which has N-type diffusion layers and P-type diffusion layers on a semiconductor substrate and has a compound film of a semiconductor and a metal on each of the surfaces of the N-type and P-type diffusion layers.

2. Description of the Related Art

To realize a high-speed fine semiconductor device, the sheet resistance of a diffusion layer must be reduced. As one means for this purpose, a compound film of a semiconductor and a metal is formed on the surface of the diffusion layer.

FIGS. 1A to 1D show a conventional method of manufacturing a CMOS (Complementary Metal Oxide Semiconductor) transistor having such a compound film on the surface of a source/drain region. According to the conventional method, as shown in FIG. 1A, an $SiO_2$ film 12 is selectively formed on the surface of an Si substrate 11 to define isolation regions. $SiO_2$ films 15 are formed as gate oxide films on the surfaces of active regions for both an NMOS (N channel MOS) region 13 and a PMOS (P channel MOS) region 14.

Then, gate electrodes are formed by polycrystalline Si films 16, and an $N^-$-type diffusion layer 17 and a $P^-$-type diffusion layer 18 are formed as LDD (Lightly Doped Drain) regions in the NMOS region 13 and the PMOS region 14, respectively. A sidewall spacer consisting of an $SiO_2$ film 21 is formed on the side surface of the polycrystalline Si film 16, and an $SiO_2$ film 22 is deposited to a film thickness of about 10 nm on the entire surface by an atmospheric pressure CVD (Chemical Vapor Deposition) method, as shown in FIG. 1B.

As shown in FIG. 1C, only the PMOS region 14 is covered with a resist 23. $As^+$ ions 24 are implanted into only the NMOS region 13 via the $SiO_2$ film 22 at an acceleration energy of 30 keV and a dose of $3\times10^{15}$ cm$^{-2}$, forming $N^+$-type diffusion layers 25 as the source and drain regions of the NMOS transistor.

After the resist 23 is removed, as shown in FIG. 1D, only the NMOS region 13 is covered with a resist 26. $BF_2^+$ ions 27 are implanted into only the PMOS region 14 via the $SiO_2$ film 22 at an acceleration energy of 30 keV and a dose of $3\times10^{15}$ cm$^{-2}$, forming $P^+$-type diffusion layers 28 as the source and drain regions of the PMOS transistor.

Thereafter, although not shown, the resist 26 and the $SiO_2$ film 22 are removed. A refractory metal film deposited on the entire surface, the Si substrate 11, and the polycrystalline Si film 16 are silicified to self-aligningly form a refractory metal silicide film on only each of the surfaces of the diffusion layers 25 and 28 and the polycrystalline Si film 16. Source and drain electrodes, a passivation film, and the like are formed to complete the CMOS transistor.

However, As is smaller in diffusion coefficient than B or the like. If the $As^+$ ions 24 are implanted via the $SiO_2$ film 22, as in the related art described above, only the diffusion layers 25 having shallow junctions can be formed. For this reason, alloy spikes tend to be formed in forming the refractory metal silicide film on the surface of the diffusion layer 25, and junction leakage easily occurs in each diffusion layer 25. It is difficult to manufacture a highly reliable CMOS transistor.

Since only the diffusion layers 25 having shallow junctions can be formed, as described above, it is difficult to decrease the impurity concentration on the surface of the diffusion layer 25. Further, since the $As^+$ ions 24 are implanted via the $SiO_2$ film 22, oxygen is mixed in the Si substrate 11 due to the knock-on effect. As a result, a silicification reaction for forming the refractory metal silicide film on the surface of the diffusion layer 25 is suppressed. It is also difficult to manufacture a CMOS transistor having the diffusion layers 25 whose sheet resistance is as sufficiently low as several $\Omega/\square$.

If no $SiO_2$ film 22 is deposited on the Si substrate 11 in order to form the diffusion layers 25 having deep junctions and suppress the knock-on effect, F of the $BF_2^+$ 27 is mixed in the Si substrate 11 to suppress a silicification reaction for forming the refractory metal suicide film on the surface of each diffusion layer 28. It becomes difficult to manufacture a CMOS transistor having the diffusion layers 28 whose sheet resistance is sufficiently low.

In addition, if no $SiO_2$ film 22 is deposited on the Si substrate 11, it becomes difficult to form the diffusion layers 28 having shallow junctions because the diffusion coefficient of B is large. The short channel effect of the PMOS transistor is conspicuous, and it also becomes difficult to manufacture a highly reliable CMOS transistor.

SUMMARY OF THE INVENTION

According to the present invention, a method of manufacturing a semiconductor device which has N-type diffusion layers and P-type diffusion layers on a semiconductor substrate and has a compound film of a semiconductor and a metal on each of surfaces of the N-type diffusion layers and the P-type diffusion layers, comprises the steps of ion-implanting an N-type impurity into an exposed surface of the semiconductor substrate to form the N-type diffusion layers, and ion-implanting a P-type impurity into the semiconductor substrate via a cover film which covers the surface of the semiconductor substrate, thereby forming the P-type diffusion layers, and forming the compound film on each of the surfaces of the N-type diffusion layer and the P-type diffusion layer after the ion implantation of the N-type impurity and the P-type impurity.

In the semiconductor device manufacturing method according to the present invention, the N-type impurity can include As.

In the semiconductor device manufacturing method according to the present invention, the cover film can include an $SiO_2$ film.

As described above, in the semiconductor device manufacturing method according to the present invention, the N-type impurity is ion-implanted in the exposed surface of the semiconductor substrate. For this reason, the N-type impurity can be ion-implanted to a relatively deep position in the semiconductor substrate, compared to a case wherein the surface of the semiconductor substrate is covered with a cover film and the N-type impurity is ion-implanted via the cover film. Therefore, even with an N-type impurity having a small diffusion coefficient such as As, an N-type diffusion layer having a relatively deep junction can be formed.

Since the N-type impurity can be ion-implanted to a relatively deep position in the semiconductor substrate, the impurity concentration on the surface of the N-type diffusion layer can be decreased. In addition, mixing of oxygen in the semiconductor substrate due to the knock-on effect can be suppressed, unlike a case using an $SiO_2$ film or the like as the cover film. In forming the compound film of the semiconductor and the metal on the surface of each N-type diffusion layer, a combining reaction can be promoted.

On the other hand, the surface of the semiconductor substrate is covered with the cover film, and the P-type impurity is ion-implanted via the cover film. Therefore, even if a compound of the P-type impurity itself and another impurity, such as $BF_2^+$, is ion-implanted, mixing of the impurity, except for the P-type impurity, in the semiconductor substrate can be suppressed. In forming the compound film of the semiconductor and the metal on the surface of each P-type diffusion layer, a combining reaction can be promoted.

In addition, since the surface of the semiconductor substrate is covered with the cover film, and the P-type impurity is ion-implanted via the cover film, the P-type impurity can be ion-implanted to a relatively shallow position in the semiconductor substrate. For this reason, even with a P-type impurity having a large diffusion coefficient such as B, a P-type diffusion layer having a relatively shallow junction can be formed.

In the semiconductor device manufacturing method according to the present invention, therefore, a combining reaction can be promoted in forming the compound film of the semiconductor and the metal on each of the surfaces of the N-type and P-type diffusion layers. A semiconductor device having N-type and P-type diffusion layers whose sheet resistances are low can be manufactured.

Moreover, since the N-type diffusion layer having a relatively deep junction can be formed, alloy spikes can be prevented in forming the compound film of the semiconductor and the metal on the surface of each N-type diffusion layer. An N-type diffusion layer having small junction leakage can be formed. In addition, since the P-type diffusion layer having a relatively shallow junction can be formed, the short channel effect can be suppressed. Therefore, a highly reliable semiconductor device can be manufactured.

In the semiconductor device manufacturing method according to the present invention, it is preferable to perform annealing to activate the N-type impurity and the P-type impurity which are ion-implanted in the semiconductor substrate, while the surface of the semiconductor substrate is covered with the $SiO_2$ film.

In the semiconductor device manufacturing method according to the present invention, it is preferable to perform rapid thermal annealing as the annealing.

As described above, in the semiconductor device manufacturing method according to the present invention, annealing for activating the N-type impurity and the P-type impurity is performed while the surface of the semiconductor substrate is covered with the $SiO_2$ film. Even if this annealing is performed in, e.g., a nitrogen atmosphere, a semiconductor nitride, which is difficult to be removed, can be prevented from being formed on the surface of the semiconductor substrate. For this reason, a uniform combining reaction can be caused in forming the compound film of the semiconductor and the metal on each of the surfaces of the N-type and P-type diffusion layers. Therefore, a semiconductor device having N-type and P-type diffusion layers whose sheet resistances are low can be manufactured.

BRIEF DESCRIPTION OF THE DRAWINGS

FIGS. 1A to 1D are side sectional views respectively showing the steps in a related art of the present invention; and FIGS. 2A to 2M are side sectional views respectively showing the steps in an embodiment of the present invention.

DETAILED DESCRIPTION OF THE PREFERRED EMBODIMENT

Figure 2C:
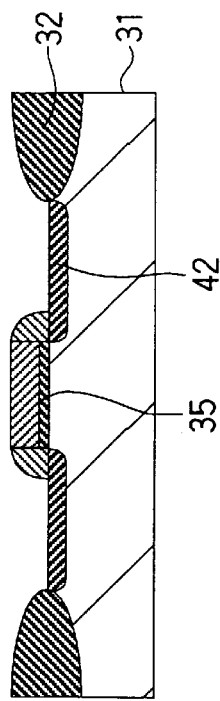
Figure 2C:
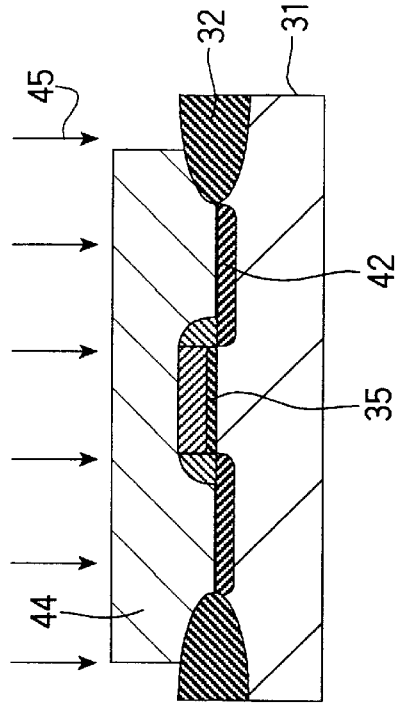
Figure 2C:
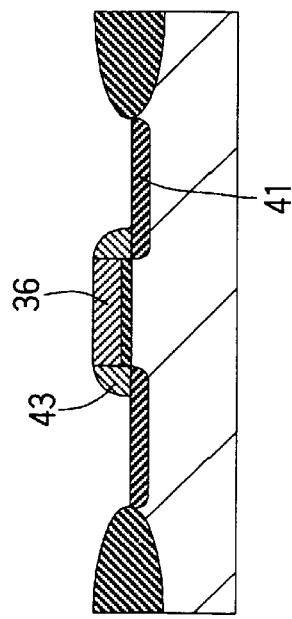

An embodiment of the present invention which is applied to the manufacture of a CMOS transistor will be described below with reference to FIGS. 2A to 2M. In this embodiment, as shown in FIG. 2A, an $SiO_2$ film 32 is selectively formed on the surface of an Si substrate 31 by a well-known LOCOS (LOCal Oxidation of Silicon) method of performing wet oxidation at a temperature of about 950° C., a trench method, or the like, thereby defining isolation regions.

Different types of impurity ions are implanted into the respective well regions of an NMOS region 33 and a PMOS region 34 in order to form buried layers (not shown) for suppressing punch-through between the sources and drains of transistors and to adjust the threshold voltages of the transistors.

$SiO_2$ films 35 as gate oxide films are formed to have a film thickness of about 8 nm on the surfaces of active regions for both the NMOS and PMOS regions 33 and 34 by performing, e.g., pyrogenic oxidation using $H_2/O_2$ at a temperature of about 850° C. A polycrystalline Si film 36 is deposited by a low pressure CVD method using $SiH_4$ as a source gas at a deposition temperature of about 620° C. The polycrystalline Si film 36 is processed into a gate electrode pattern by well-known photolithography and dry etching.

Note that an amorphous Si film and the like may be used in place of the polycrystalline Si film 36. In this embodiment, a silicide film is self-aligningly formed on the upper surface of the polycrystalline Si film 36 in a subsequent step. However, if the self-aligning formation of the silicide film is not performed, a silicide film such as a $WSi_2$ film or the like may be continuously deposited on the polycrystalline Si film 36 to form a polycide layer, or an offset $SiO_2$ film for self-aligning contact may be continuously deposited on the polycrystalline Si film 36.

Next, as shown in FIG. 2B, $As^+$ ions 37 and the like are implanted into the NMOS region 33 at an acceleration energy of 20 keV and a dose of $6 \times 10^{12}$ $cm^{-2}$. $BF_2^+$ ions 38 are implanted in the PMOS region 34 at an acceleration energy of 20 keV and a dose of $2 \times 10^{13}$ $cm^{-2}$. An $N^-$-type diffusion layer 41 and a $P^-$-type diffusion layer 42 are formed as LDD regions.

As shown in FIG. 2C, an $SiO_2$ film 43 is deposited to a film thickness of about 150 nm by an atmospheric pressure CVD method using $SiH_4$ as a source gas, a low pressure CVD method using TEOS (TEtraethyl OrthoSilicate) as a source gas, an atmospheric pressure CVD method using $O_3$+TEOS as a source gas, or the like. The $SiO_2$ film 43 is etched back by anisotropic dry etching to form a sidewall spacer consisting of the $SiO_2$ film 43 on the side surface of each polycrystalline Si film 36. Note that an SiN film and the like may be used in place of the $SiO_2$ film 43.

Figure 2D:
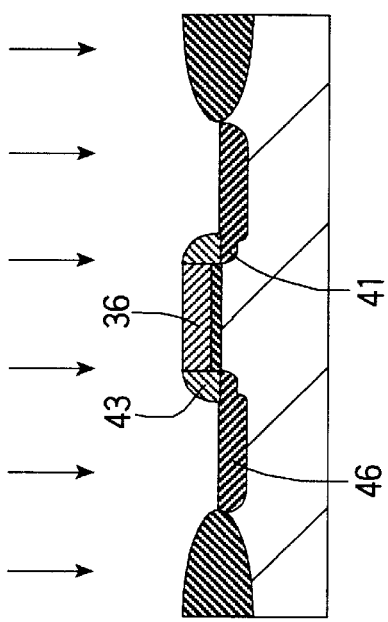

As shown in FIG. 2D, only the PMOS region 34 is covered with a resist 44. $As^+$ ions 45 are implanted into only the NMOS region 33 at an acceleration energy of 60 keV and a dose of $3 \times 10^{15}$ $cm^{-2}$ by using the resist 44, the polycrystalline Si film 36 and the $SiO_2$ films 32 and 43 as a mask, thereby forming $N^+$-type diffusion layers 46 as the source and drain regions of the NMOS transistor.

In a region to form the diffusion layers 46, the $As^+$ ions 45 are implanted in the exposed surface of the Si substrate 31. The diffusion coefficient of As is small. For this reason, even if the $As^+$ ions 45 are implanted at a high acceleration energy of 60 keV, the junctions of the diffusion layers 46 are not so deep, and the short channel effect of the NMOS transistor can be suppressed.

If the As$^+$ ions 45 are implanted in the exposed surface of the Si substrate 31, channeling occurs, and the threshold voltage becomes lower than that in a case wherein the surface of the Si substrate 31 is covered with an SiO$_2$ film and the As$^+$ ions 45 are implanted via this SiO$_2$ film. However, since the change rate of the threshold voltage to a change in gate length is constant regardless of the presence of the SiO$_2$ film, a desired threshold voltage can be obtained by adjusting the impurity concentration of a channel region.

Further, if the As$^+$ ions 45 are implanted in the exposed surface of the Si substrate 31, the Si substrate 31 is contaminated, compared to the case wherein the surface of the Si substrate 31 is covered with an SiO$_2$ film and the As$^+$ ions 45 are implanted via this SiO$_2$ film. However, if a silicide film is formed on the surface of the diffusion layer, this contamination does not cause a problem.

Figure 2E:
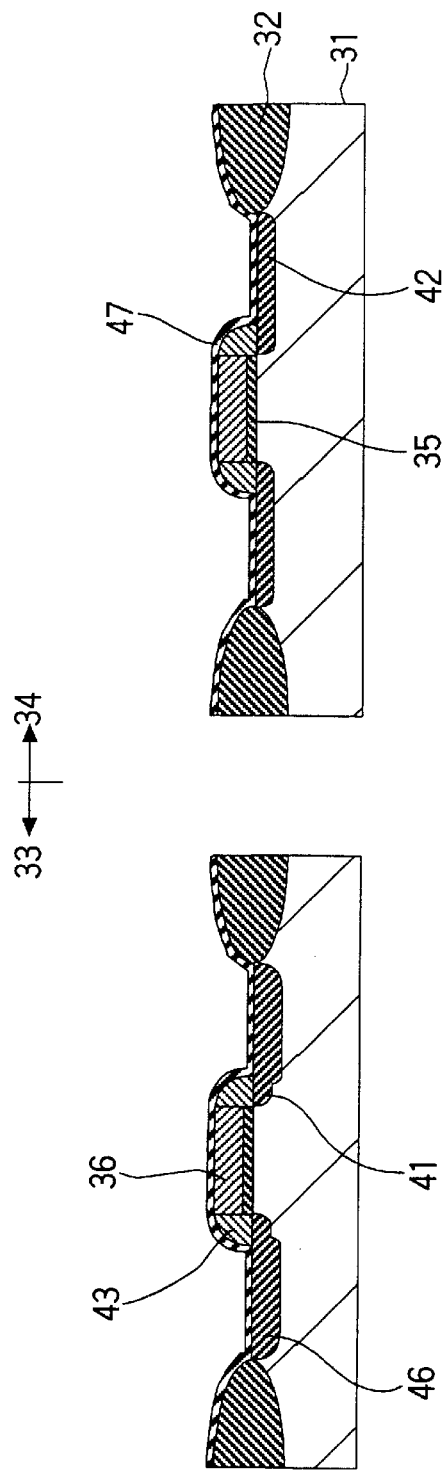

Then, as shown in FIG. 2E, the resist 44 is removed. An SiO$_2$ film 47 is deposited to a film thickness of about 10 nm on the entire surface by a low pressure CVD method using TEOS as a source gas, an atmospheric pressure CVD method using SiH$_4$ as a source gas, or the like.

Figure 2F:
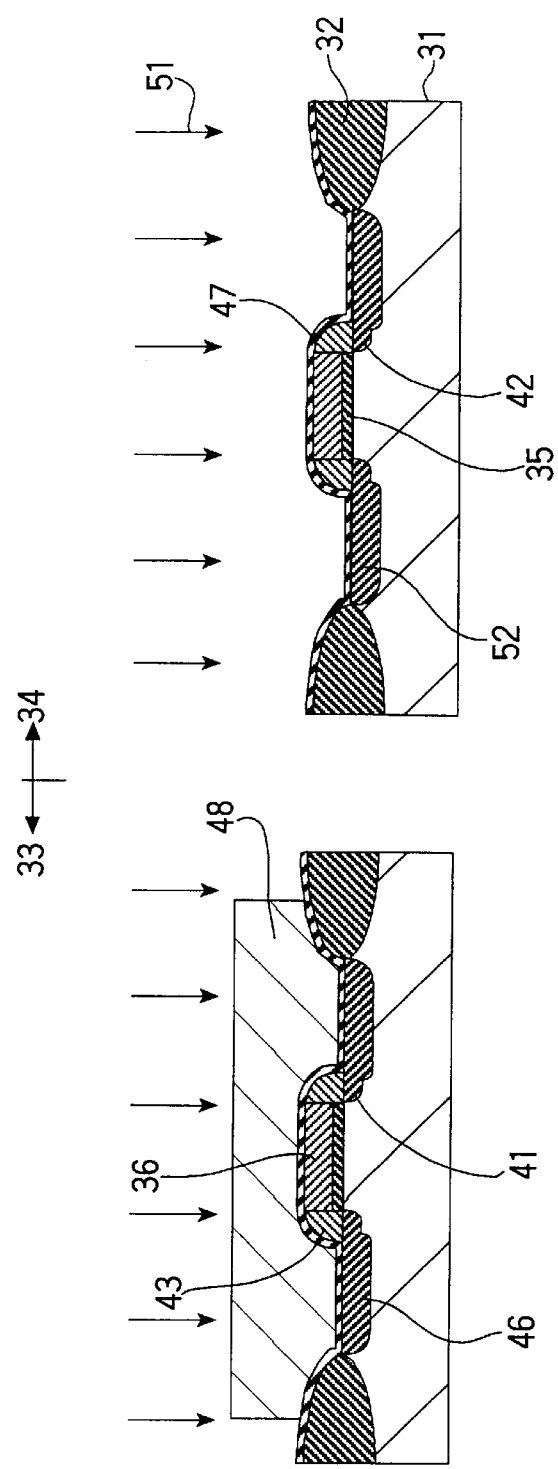

As shown in FIG. 2F, only the NMOS region 33 is covered with a resist 48. BF$_2^+$ ions 51 are implanted into only the PMOS region 34 via the SiO$_2$ film 47 at an acceleration energy of 40 keV and a dose of $3 \times 10^{15}$ cm$^{-2}$ by using the resist 48, the polycrystalline Si film 36 and the SiO$_2$ films 32 and 43 as a mask, thereby forming P$^+$-type diffusion layers 52 as the source and drain regions of the PMOS transistor.

The resist 48 is removed while the SiO$_2$ film 47 is left. The resultant structure is rapidly thermally annealed in a nitrogen atmosphere at 1,000° C. for 10 sec to activate an impurity in the diffusion layers 46 and 52.

If the SiO$_2$ film 47 is removed, and then this annealing is performed, an SiN film is formed on the surface of the Si substrate 31 and the upper surface of the polycrystalline Si film 36. This SiN film is difficult to be removed by etching with hydrofluoric acid or the like. A silicification reaction on the surface of the Si substrate 31 and the upper surface of the polycrystalline Si film 36 becomes nonuniform. For this reason, in this embodiment, annealing is performed with the SiO$_2$ film 47 being left, as described above.

Figure 2G:
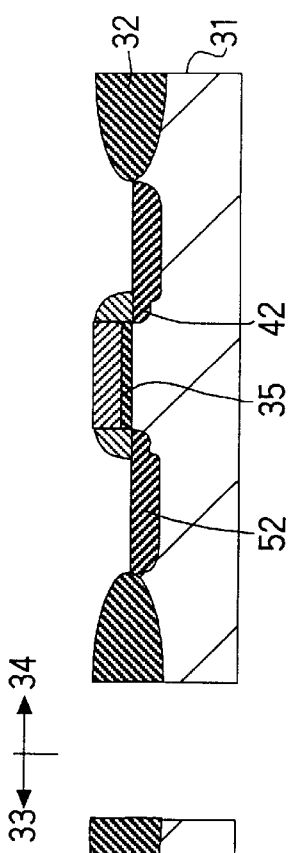
Figure 2H:
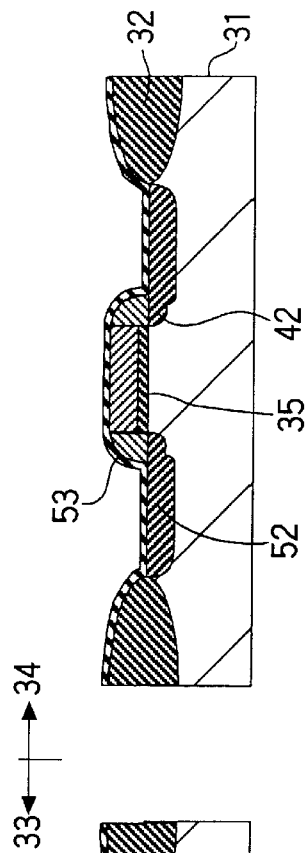

Next, as shown in FIG. 2G, the SiO$_2$ film 47 is removed by wet etching using, e.g., hydrofluoric acid, buffer hydrofluoric acid as a solution mixture of hydrofluoric acid and ammonium fluoride, anisotropic dry etching, or the like. As shown in FIG. 2H, a refractory metal film 53 as a Ti film, a Co film, an Ni film, a Pt film, or the like is deposited to a film thickness of about 30 nm on the entire surface by a CVD method or a vapor deposition method.

Figure 2I:
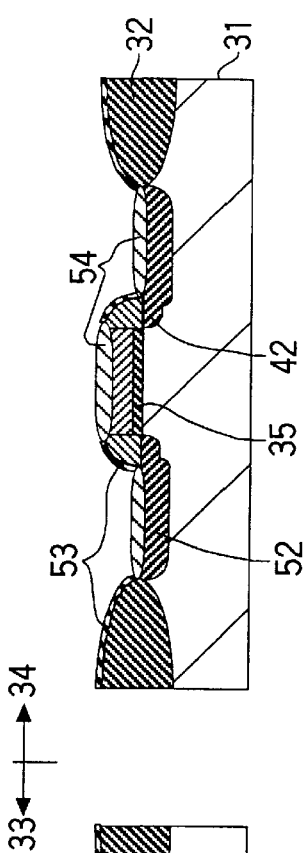

As shown in FIG. 2I, the first stage of rapid thermal annealing is performed in a nitrogen or argon atmosphere at 650° C. for 30 sec. The refractory metal film 53, the Si substrate 31 and the polycrystalline Si film 36 are silicified to self-aligningly form refractory metal silicide films 54 of C49 phase on only the surfaces of the diffusion layers 46 and 52 and the upper surface of the polycrystalline Si film 36.

As shown in FIG. 2J, the refractory metal film 53 left without being silicified because it is formed on the SiO$_2$ films 32 and 43 is selectively removed by etching using ammonia, hydrogen peroxide and water (NH$_3$:H$_2$O$_2$:H$_2$O= 1:2:6) at room temperature for 10 min. Note that a combination of hydrochloric acid, hydrogen peroxide and water, a combination of sulfuric acid, hydrogen peroxide and water, and the like may be used in place of the combination of ammonia, hydrogen peroxide and water.

As shown in FIG. 2K, the second stage of rapid thermal annealing is performed in a nitrogen or argon atmosphere at 800° C. for 30 sec. The refractory metal silicide films 54 of C49 phase are phase-transited to form refractory metal silicide films 55 of C54 phase whose sheet resistance is as low as about 5Ω/□.

Figure 2L:
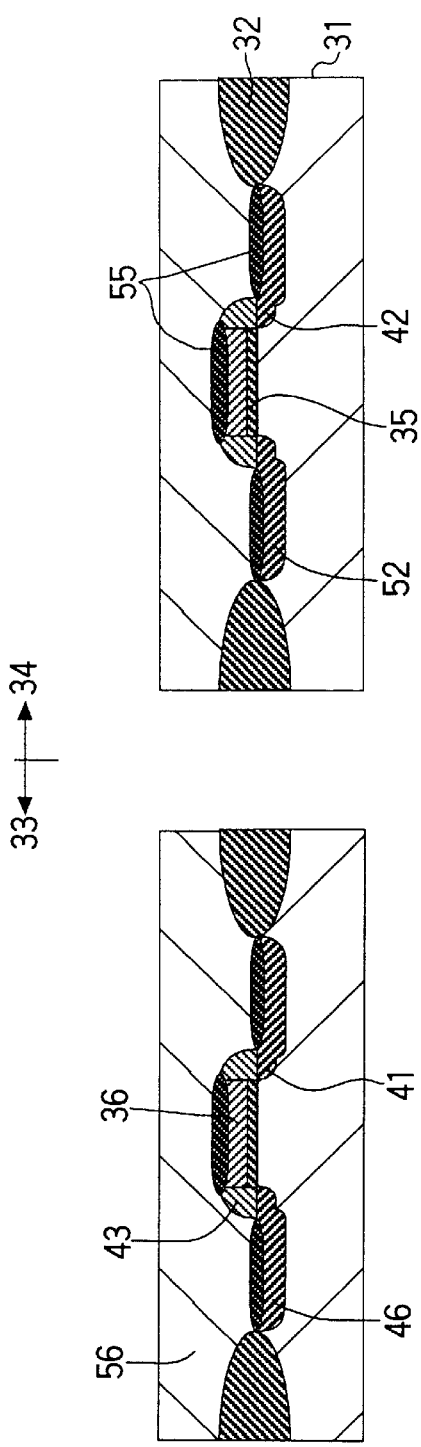
Figure 2M:
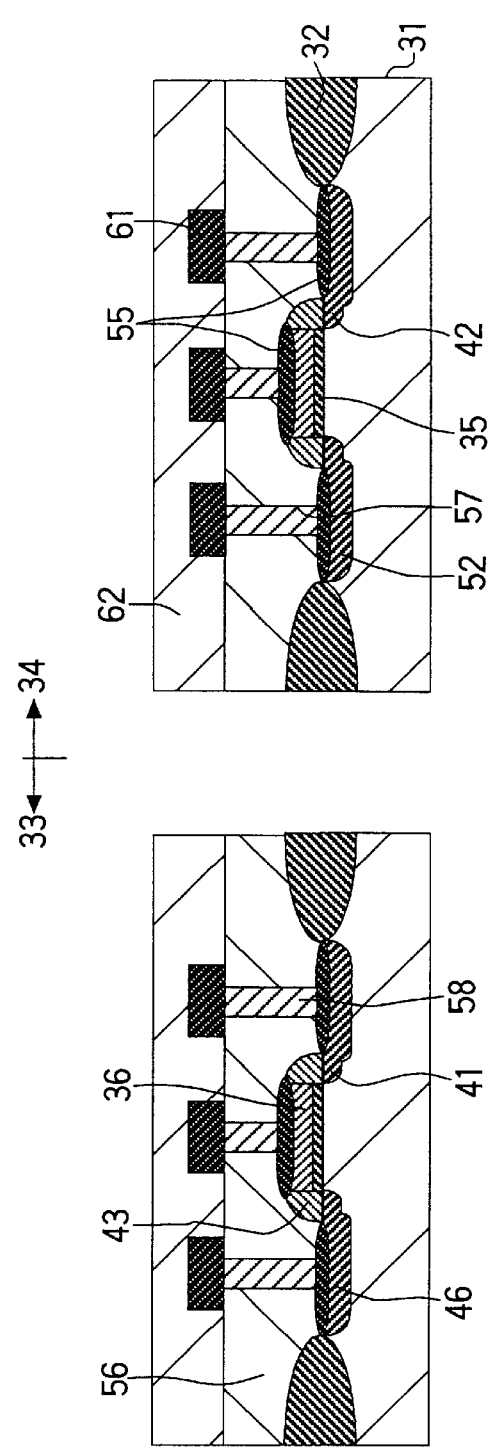

As shown in FIG. 2L, an interlevel dielectric film 56 is formed on the entire surface. Thereafter, as shown in FIG. 2M, contact holes 57 are formed to reach the refractory metal silicide films 55. The contact holes 57 are buried with tungsten plugs 58 or the like. Al interconnections 61, a passivation film 62, and the like are formed to complete the CMOS transistor.

In the above embodiment, two stages of annealing are performed for a silicification reaction to form the refractory metal silicide films 55. Alternatively, a silicification reaction may be caused by one stage of annealing. In the above embodiment, the present invention is applied to the manufacture of a CMOS transistor. However, the present invention can also be applied to the manufacture of semiconductor devices other than the CMOS transistor, as a matter of course.

What is claimed is:

1. A method of manufacturing a semiconductor device which has N$^{(+)}$-type diffusion layers and P$^{(+)}$-type diffusion layers on a semiconductor substrate and has a compound film of a semiconductor and a refractory metal on each of surfaces of said N$^{(+)}$-type diffusion layers and said P$^{(+)}$-type diffusion layers, comprising the steps of:

ion implanting an N-type impurity into an exposed surface of an N$^{(-)}$-type diffusion layer of said semiconductor substrate to form said N$^{(+)}$-type diffusion layers;

depositing an oxidized cover film onto each of said surfaces;

ion-implanting a P-type impurity into a P$^{(-)}$-type diffusion layer of said semiconductor substrate via said cover film, thereby forming said P$^{(+)}$-type diffusion layers;

performing a first annealing step to activate said N-type impurity and said P-type impurity which are ion-implanted in said semiconductor substrate;

removing said oxidized cover film from each of said surfaces after said first annealing step; and forming said compound film and said refractory metal on each of said surfaces of said N$^{(+)}$-type diffusion layer and said P$^{(+)}$-type diffusion layer after the ion implantation of said N-type impurity and said P-type impurity.

2. The method according to claim 1, wherein said N-type impurity includes As.

3. The method according to claim 1, wherein said cover film includes an SiO$_2$ film.

4. The method according to claim 1, wherein said semiconductor device has a gate electrode which comprises a polycrystalline Si film, and said refractory metal is formed in contact with said polycrystalline Si film, and said method further comprises:

performing a second annealing step, wherein as a result of said second annealing step, said compound film is a refractory metal silicide film of C49 phase resulting from a silicide of said refractory metal with said semiconductor substrate and said polycrystalline Si film.

5. The method according to claim 4, further comprising:

performing a third annealing step to phase transit said refractory metal silicide film of C49 phase to a refractory metal silicide film of C54 phase.

6. The method according to claim 5, wherein said third annealing step is a rapid thermal annealing.

7. A method of manufacturing a semiconductor device, comprising the steps of:

ion implanting an N-type impurity into first exposed regions of a semiconductor substrate to form $N^{(-)}$ type diffusion layers;

ion-implanting a P-type impurity into second exposed regions of said semiconductor substrate to form $P^{(-)}$-type diffusion layers;

ion-implanting an N-type impurity into said first exposed region at a concentration sufficient to form $N^{(+)}$-type diffusion layers from said $N^{(-)}$-type diffusion layers;

depositing a cover film comprising $SiO_2$ onto said first and second exposed regions, thereby covering said first and second exposed regions;

ion implanting a P-type impurity into said covered second region via said cover film thereby forming $P^{(+)}$-type diffusion layers; and forming a compound film comprising a refractory metal on surfaces of said $N^{(+)}$-type diffusion layer and said $P^{(+)}$-type diffusion layer.

8. The method according to claim 7, wherein said N-type impurity includes As.

9. The method according to claim 7, further comprising:

performing a first annealing step to activate said N-type impurity and said P-type impurity which are ion-implanted in said first and second regions after said forming $P^{(+)}$-type diffusion layers; and removing said oxidized cover film from each of said surfaces after said first annealing step and before said forming a compound film.

10. The method according to claim 9, wherein said first annealing step is rapid thermal annealing.

11. The method according to claim 9, wherein said semiconductor device has a gate electrode which comprises a polycrystalline Si film, and said refractory metal is formed in contact with said polycrystalline Si film, and said method further comprises:

performing a second annealing step, wherein as a result of said second annealing step, said compound film is a refractory metal silicide film of C49 phase resulting from a silicide of said refractory metal with said semiconductor substrate and said polycrystalline Si film.

12. The method according to claim 11, further comprising a third annealing step to phase transit said refractory metal silicide film of C49 phase to a refractory metal silicide film of C54 phase.

13. The method according to claim 12, wherein said third annealing step is a rapid thermal annealing.

14. The method according to claim 1, wherein said first annealing step is rapid thermal annealing.

15. The method according to claim 4, wherein said semiconductor device has $SiO_2$ isolation regions and $SiO_2$ sidewalls formed in contact with said polycrystalline Si film, and said refractory metal is formed in contact with said $SiO_2$ isolation regions and said $SiO_2$ sidewalls, and said method further comprises:

removing said refractory metal in a non-silicide state from said $SiO_2$ isolation regions and said $SiO_2$ sidewalls after said performing a second annealing step; and performing a third annealing step to phase transit said refractory metal silicide film of C49 phase to a refractory metal silicide film of C54 phase.

16. The method according to claim 11, wherein said second annealing step is rapid thermal annealing.

17. The method according to claim 9, wherein said semiconductor device has $SiO_2$ isolation regions and $SiO_2$ sidewalls formed in contact with said polycrystalline Si film, and said refractory metal is formed in contact with said $SiO_2$ isolation regions and said $SiO_2$ sidewalls, and said method further comprises:

removing said refractory metal in a non-silicide state from said $SiO_2$ isolation regions and said $SiO_2$ sidewalls after said performing a second annealing step; and performing a third annealing step to phase transit said refractory metal silicide film of C49 phase to a refractory metal silicide film of C54 phase.

* * * * *